US007010131B1

(12) United States Patent
Rhode et al.

(10) Patent No.: US 7,010,131 B1
(45) Date of Patent: Mar. 7, 2006

(54) QUASI-DIFFERENTIAL POWER AMPLIFIER AND METHOD

(75) Inventors: Jason P. Rhode, Austin, TX (US); John J. Paulos, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/079,864

(22) Filed: May 15, 1998

(51) Int. Cl.
H03F 21/00 (2006.01)
H03F 3/45 (2006.01)
H04R 3/00 (2006.01)

(52) U.S. Cl. .................... 381/120; 381/111; 330/69
(58) Field of Classification Search ............... 381/309, 381/74, 120, 370, 27–28, 111, 104, 307, 18–19, 381/61, 1; 330/251, 10, 207.4, 250, 124 R, 330/69
See application file for complete search history.

(56) References Cited

U.S. PATENT DOCUMENTS

| 4,249,095 A | * | 2/1981 | Hsu ........................... 330/253 |
|---|---|---|---|
| 4,747,142 A | * | 5/1988 | Tofte ........................... 381/27 |
| 4,841,573 A | * | 6/1989 | Fujita ......................... 381/27 |
| 4,980,915 A | * | 12/1990 | Ishikawa ..................... 381/27 |
| 5,007,091 A | | 4/1991 | Alasaarela .................. 381/26 |
| 5,218,641 A | | 6/1993 | Abe et al. ..................... 381/79 |
| 5,243,656 A | * | 9/1993 | Tanida et al. ................. 381/28 |
| 5,245,296 A | | 9/1993 | Miller et al. ................. 330/85 |
| 5,334,949 A | | 8/1994 | Sone ........................... 330/253 |
| 5,357,609 A | | 10/1994 | Sellers et al. ............... 395/200 |
| 5,396,551 A | * | 3/1995 | Lucey ........................... 381/4 |
| 5,424,678 A | | 6/1995 | Heyl et al. ..................... 330/51 |
| 5,426,622 A | | 6/1995 | Orozov ........................ 369/24 |
| 5,450,622 A | | 9/1995 | Vandegraaf ................. 455/222 |
| 5,467,400 A | | 11/1995 | Keir ............................ 381/61 |
| 5,475,323 A | | 12/1995 | Harris et al. ................. 327/67 |
| 5,493,620 A | | 2/1996 | Pulfrey ........................ 381/96 |
| 5,517,572 A | | 5/1996 | Heyl ........................... 381/94 |
| 5,544,242 A | | 8/1996 | Robinson .................... 379/390 |
| 5,631,606 A | * | 5/1997 | Tran ........................... 330/253 |
| 5,638,030 A | * | 6/1997 | Du ............................. 330/261 |
| 5,652,542 A | * | 7/1997 | Fink ............................ 330/2 |
| 5,970,153 A | * | 10/1999 | Petroff ......................... 381/17 |
| 5,973,555 A | * | 10/1999 | Kokubo et al. ......... 330/124 R |
| 6,181,796 B1 | * | 1/2001 | Johnson ....................... 381/28 |
| 6,782,107 B1 | * | 8/2004 | Gleim ......................... 381/104 |

* cited by examiner

*Primary Examiner*—Laura A. Grier
(74) *Attorney, Agent, or Firm*—James J. Murphy; Thompson & Knight LLP

(57) ABSTRACT

A quasi-differential power amplifier and method are disclosed that enhance drive capability and dynamic range by driving a right, left and common terminals with a right channel output signal, a left channel output signal, and a common mode output signal that are each a combination of the left and right channel input signals. In addition, the common mode output signal may be used as feedback so that the left and right channel output signals so that these signals are dependent upon feedback from the common mode output signal. The quasi-differential power amplifier may include a first amplifier driving the left channel output signal, a second amplifier driving the right channel output signal, and a third amplifier driving the common mode output signal. In one application, the quasi-differential amplifier may be used to drive three-wire stereo headphones for use in small portable stereo systems.

5 Claims, 5 Drawing Sheets

QUASI-DIFFERENTIAL POWER AMPLIFIER AND METHOD

BACKGROUND OF THE INVENTION

1. Field of the Invention

The present invention relates to integrated circuit (IC) amplifiers, and more specifically to IC power amplifiers for driving three-wire stereo headphones in small portable stereo systems.

2. Description of the Related Art

Small portable stereo systems generally include a digital audio source, a digital volume control, a digital-to-analog converter (DAC), and an integrated circuit (IC) power amplifier for driving analog output signals to stereo headphones. The vast majority of these stereo headphones have a three-wire connection consisting of a left (L) terminal, a right (R) terminal, and a common (C) terminal. The IC power amplifier typically includes a first amplifier that drives a left (L) channel signal connected to the left (L) terminal and a second amplifier that drives a right (R) channel signal connected to the right (R) terminal. The common (C) terminal of the headphone is generally connected to system ground (GND).

Because of the low voltage supplies used to power these portable stereo systems, the dynamic range and maximum power delivered by typical power amplifiers to the stereo headphones are limited. For example, with a typical IC power amplifier and a low voltage supply, such as a 3 volt supply, the left (L) and right (R) channel outputs can be driven from approximately 0.5 volts to 2.5 volts. This signal range limits the maximum sine wave that may be delivered to the headphone to about 0.707 volts rms and limits the maximum power into each channel to about $(0.707\ \text{V rms})^2/32\ \Omega = 15\ \text{mW}$. In addition, with a typical IC power amplifier, the left (L) and right (R) terminals must be AC coupled to the IC power amplifier through large capacitors to provide a low frequency pole for the left (L) and right (R) headphone speakers. For example, assuming right (R) and left (L) headphone speakers having a typical value of about 32 Ω, the coupling capacitors must be about 100 μF to place the low frequency RC pole at about 50 Hz. The cost of two large capacitors, such as 100 μF capacitors, is a significant problem for these types of systems.

To eliminate the need for the AC coupling capacitors, a third amplifier may be added to the IC power amplifier to drive the common (C) terminal of the headphone at a fixed common mode (CM) voltage ($V_{CM}$). This fixed common mode driver approach, however, requires that the third amplifier have approximately twice the current drive capability of the left (L) channel and right (R) channel amplifiers at peak current loads. This additional high power third amplifier significantly increases the power consumption of the IC power amplifier and does not increase the maximum power deliverable to the headphone. For example, in a typical system, there is a particular volume control setting that will cause the power amplifier to just barely clip the signal when given a full scale signal from the digital audio source. Because the program material being processed by the digital audio source typically does not contain any full scale signals, the volume control will often have settings that exceed this clipping limit. Assuming that the output of the right (R) and left (L) channel drive amplifiers can swing from $V_{CM}-1$ volts to $V_{CM}+1$ volts without clipping, the maximum voltage that the IC power amplifier in the fixed common mode approach can deliver to the headphones without clipping is about 2 $V_{PP}$ (volts peak-to-peak).

SUMMARY OF THE INVENTION

In accordance with the present invention, a quasi-differential power amplifier enhances drive capability and dynamic range by providing a first output signal, a second output signal, and a common mode output signal that are each a combination of a first and a second input signals. In one embodiment, the common mode output signal is used as feedback to the first and second output signals. In a further embodiment, the input signals are digital, and the quasi-differential power amplifier includes a first and second digital-to-analog converters coupled to the first and second input signals, a first amplifier driving the first output signal, a second amplifier driving the second output signal, and a third amplifier driving the common mode output signal. In one application, the input signals are a right and left channel audio input signals, and the output signals are used to drive three-wire stereo headphones.

DESCRIPTION OF THE PREFERRED EMBODIMENTS

Figure 1:
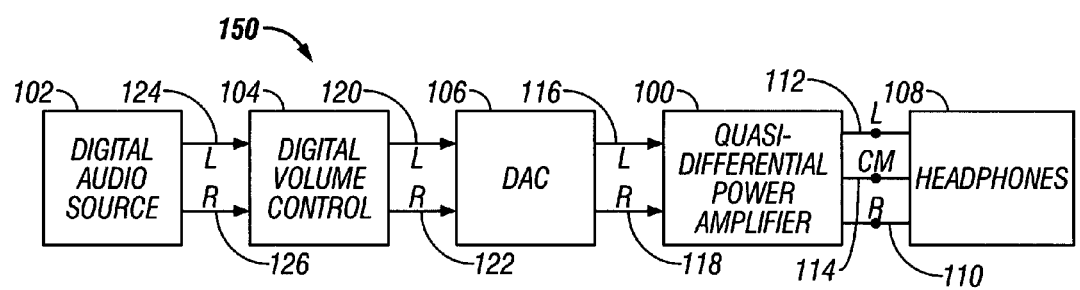
FIG. 1 is a block diagram of a system including a quasi-differential power amplifier according to the present invention.

Referring to FIG. 1, a system 150 is shown that includes a quasi-differential power amplifier 100 connected to a digital-to-analog converter (DAC) 106 and three-wire headphones 108. System 150 also includes a digital audio source 102 connected to a digital volume control block 104, which is in turn connected to a DAC 106. The digital audio source 102 provides a left (L) channel output 124 and a right (R) channel output 126 to the digital volume control 104, which in turn provides a volume adjusted left (L) channel output 120 and a volume adjusted right (R) channel output 122 to the DAC 106. The DAC 106 provides an analog left (L) channel output 116 and an analog right (R) channel output 118 to the quasi-differential power amplifier 100. The quasi-differential power amplifier 100 drives the three input terminals of the headphone 108 with left (L) channel signal 112, right (R) channel signal 110, and common mode (CM) signal 114.

In one embodiment, the system 150 may be a small portable stereo system including three-wire stereo headphones 108. It is noted that the embodiment for system 150 depicted in FIG. 1 is an example embodiment and that alternative implementations could be designed and utilized. For example, the left (L) channel output 116 and right (R) channel output 118 could be any two signals desired to be input to the quasi-differential power amplifier 100, and the left (L) channel signal 112, right (R) channel signal 110, and common mode (CM) signal 114 could be the output signals of the quasi-differential power amplifier 100. Thus, the input and output signals are not required to relate to a left (L) and right (R) channel stereo signal.

Figure 2:
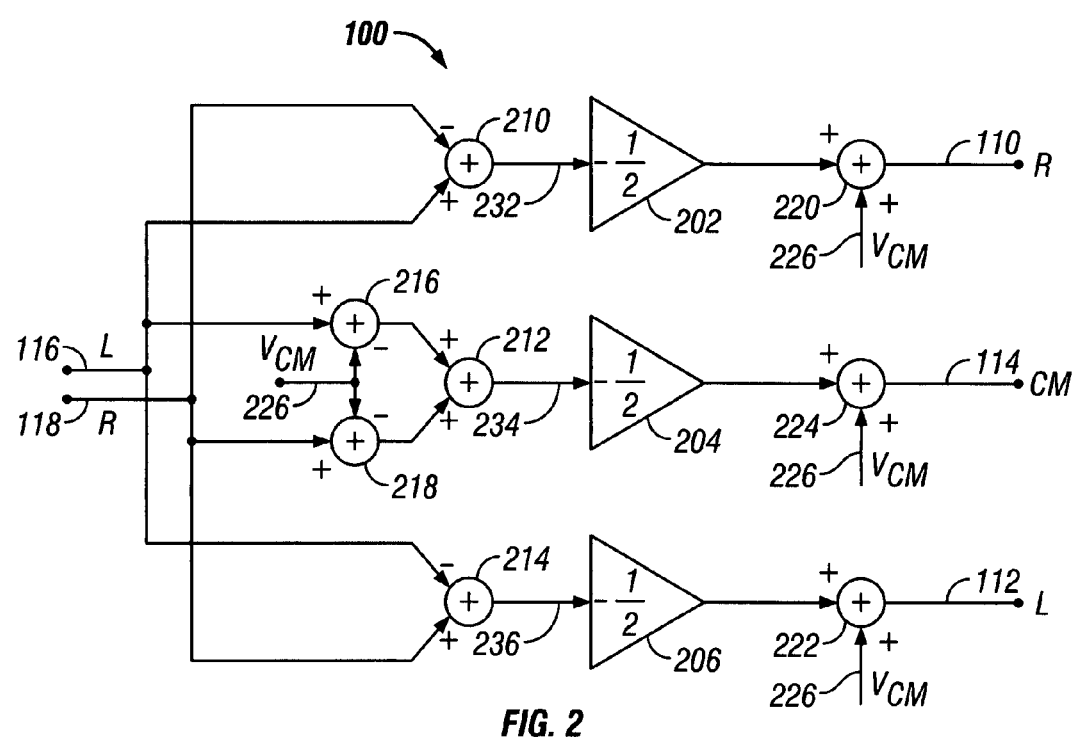
FIG. 2 is a block diagram of an embodiment for a quasi-differential power amplifier according to the present invention.

FIG. 2 shows an embodiment for a quasi-differential power amplifier 100 according to the present invention. The analog left (L) channel output 116 from DAC 106 is connected as a positive input to adders 210 and 216 and is connected as a negative input to adder 214. The analog right (R) channel output 118 from DAC 106 is connected as a positive input to adders 214 and 218 and is connected as a negative input to adder 210. A common mode voltage ($V_{CM}$) 226 is connected as a negative input to adders 216 and 218. The outputs of adders 216 and 218 are connected as positive inputs to adder 212. The outputs 232, 234, and 236 of adders 210, 212, and 214 are connected to amplifiers 202, 204, and 206, respectively, which each have an inverted gain of −½. The outputs of amplifiers 202, 204, and 206 are connected as positive inputs to adders 220, 224, and 222, respectively, which also receive the common mode voltage ($V_{CM}$) 226 as a positive input. The output of adder 220 is the right (R) channel signal 110; the output of adder 222 is the left (L) channel signal 112; and the output of adder 224 is the common mode (CM) signal 114. To simplify FIG. 2, the left (L) and right (R) channel analog audio inputs 116 and 118 from DAC 106 are shown as single-ended signals, although it is understood that these signals may be implemented as differential or single-ended signals, as desired.

In operation, the left (L) channel analog audio input 116 from DAC 106 consists of a signal voltage ($V_L$) plus a common mode voltage ($V_{CM}$). Similarly, the right (R) channel analog audio input 118 from DAC 106 consists of a signal voltage ($V_R$) plus a common mode voltage ($V_{CM}$). Although analog audio inputs 116 and 118 are shown as single lines in FIG. 2, it is understood that they may be implemented as differential signals, allowing them to swing 4 $V_{pp}$. The output 232 of adder 210 is $(V_L+V_{CM})-(V_R+V_{CM})=V_L-V_R$. The output 236 of adder 214 is $(V_R+V_{CM})-(V_L+V_{CM})=V_R-V_L$. The output 234 of adder 212 is $(V_R+V_{CM})+(V_L+V_{CM})-2V_{CM}=V_R+V_L$. The left (L) channel output signal ($L_{OUT}$) 112 from adder 222, the right (R) channel output signal ($R_{OUT}$) 110 from adder 220, and the common mode (CM) output signal ($CM_{OUT}$) 114 from adder 226 are as follows:

$L_{OUT}=V_{CM}+(V_L-V_R)/2;$ $R_{OUT}=V_{CM}+(V_R-V_L)/2;$ and $CM_{OUT}=V_{CM}-(V_L+V_R)/2.$ The signals which are actually applied to the right and left speakers of the headphone 108 are the following:

$L_{speaker}=L_{OUT}-CM_{OUT}=[V_{CM}+(V_L-V_R)/2]-[V_{CM}-(V_L+V_R)/2]=V_L;$ and $R_{speaker}=R_{OUT}-CM_{OUT}=[V_{CM}+(V_R-V_L)/2]-[V_{CM}-(V_R+V_L)/2]=V_R.$ Although it is not practical to drive the left (L) and right (R) terminals of the headphone fully differentially, the quasi-differential power amplifier of the present invention provides substantially greater drive capability and increased dynamic range and reduces power consumption compared to prior single-ended drive techniques, such as those used by prior grounded power amplifier and fixed common mode amplifier approaches. The quasi-differential power amplifier of the present invention achieves these advantages by providing a left channel output signal, a right channel output signal, and a common mode output signal that are each a combination of the left and right channel input signals.

An example of this advantage may be seen in the situation where $V_L=V_{CM}+2$ volts and $V_R=V_{CM}$. Assuming these values, $CM_{OUT}$ and $R_{OUT}$ will be both be driven to values of $V_{CM}-1$ volt, while $L_{OUT}$ will be driven to a value of $V_{CM}+1$ volt. As desired, a 2 volt signal will ultimately be applied to the left speaker, while a 0 volt signal is applied to the right speaker. Thus, for the quasi-differential power amplifier of the present invention, a non-clipped signal will be applied to each speaker. In contrast, for the prior grounded power amplifier and fixed common mode amplifier approaches, a clipped signal of +1 volt would be applied to the left speaker due to clipping of the $V_L$ signal to $V_{CM}+1$ volt, and a 0 volt signal would be applied to the right speaker. This case illustrates, therefore, the potential for increased signal swing available utilizing the quasi-differential power amplifier according to the present invention.

One potential drawback for the embodiment depicted in FIG. 2, however, is that the signal level which causes the right (R) channel to clip is dependent on the signal level in the left (L) channel and vice versa. Assuming that the output of the right channel signal ($R_{OUT}$) 110 and left channel signal ($L_{OUT}$) 112 can swing from $V_{CM}-1$ volts to $V_{CM}+1$ volts without clipping, the power amplifier 100 will clip whenever the instantaneous value of $|V_L-V_R|>2$. Three different signal level conditions illustrate example clipping situations. In a first case, assuming $|V_L|$ and $|V_R|\leq 1$ volt, neither output channel will be clipped, regardless of polarity of the signals. In a second case, assuming $V_L=+2$ volts and $V_R=-2$ volts, $CM_{OUT}$ will be driven to a value of $V_{CM}$. Ideally without clipping, $L_{OUT}$ and $R_{OUT}$ would be driven to $V_{CM}+2$ volts and $V_{CM}-2$ volts, respectively. Because $L_{OUT}$ will clip at $V_{CM}+1$ volt and $R_{OUT}$ will clip at $V_{CM}-1$ volt, however, a clipped signal will ultimately be applied to each speaker. An analogous situation occurs if $V_L=-2$ volts and $V_R=+2$ volts. In a third case, assuming $V_L$ and $V_R=+2$ volts, $CM_{OUT}$ would be ideally driven to a value of $V_{CM}-2$ volts, but will clip at $V_{CM}-1$ volt. Because the $L_{OUT}$ and $R_{OUT}$ signals will both be at $V_{CM}$, a clipped signal will ultimately be delivered to both speakers. An analogous situation occurs when both $V_L$ and $V_R=-2$ volts.

Considering the above clipping situations, the embodiment of FIG. 2 will encounter clipping for two primary reasons—large signals of opposite polarity (Case two) and large signals of the same polarity (case three). In second case situations, the clipping occurs at the $L_{OUT}$ and $R_{OUT}$ terminals. In third case situations, the clipping occurs at the $CM_{OUT}$ terminal, while the $L_{OUT}$ and $R_{OUT}$ terminals are at $V_{CM}$. By incorporating a mechanism to detect clipping on the $CM_{OUT}$ terminal and to adjust the $L_{OUT}$ and $R_{OUT}$ terminals to compensate, the third case clipping situation may be avoided. As discussed further below, second case situations are relatively rare and are less of a concern.

Figure 3:
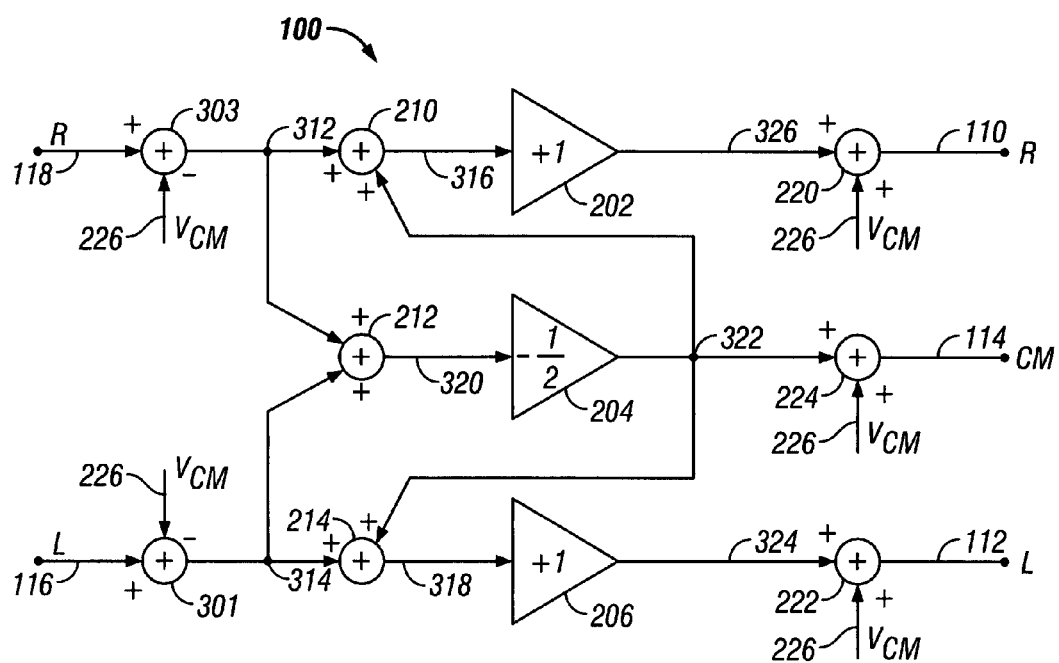
FIG. 3 is a block diagram of an alternative embodiment for a quasi-differential power amplifier according to the present invention.

FIG. 3 shows an alternative embodiment for a quasi-differential headphone power amplifier 100 that provides a feedback mechanism to compensate for third case clipping situations. The analog left (L) channel output 116 from DAC 106 is connected as a positive input to adder 301, and the analog right (R) channel output 118 from DAC 106 is connected as a positive input to adder 303. Adders 303 and 301 also receive the common mode voltage ($V_{CM}$) 226 as a negative input. The output 312 of adder 303 is connected as a positive input to adders 210 and 212. The output 314 of adder 303 is connected as a positive input to adders 214 and 212. The output 320 of adder 212 is connected to amplifier 204, which has a negative gain of −½. The output of amplifier 204 is connected as a positive input to adders 210 and 214. The outputs 316 and 318 of adders 210 and 214 are connected to amplifiers 202 and 206, respectively, which each have a positive gain of +1. The outputs of amplifiers 202, 204, and 206 are connected as positive inputs to adders 220, 224, and 222, respectively, which also receive the common mode voltage ($V_{CM}$) 226 as a positive input. As in FIG. 2, the output of adder 220 is the right (R) channel signal 110; the output of adder 222 is the left (L) channel signal 112; and the output of adder 224 is the common mode (CM) signal 114.

In operation, a portion of the $CM_{OUT}$ signal from the output of amplifier 204 is provided as feedback to adders 210 and 214. This feedback is combined with the left (L) and right (R) channel signals to adjust the resulting $L_{OUT}$ and $R_{OUT}$ signal levels to compensate for any clipping which may occur at the $CM_{OUT}$ terminal. As with FIG. 2, the left (L) channel analog audio input 116 from DAC 106 consists of a signal voltage ($V_L$) plus a common mode voltage ($V_{CM}$). Similarly, the right (R) channel analog audio input 118 from DAC 106 consists of a signal voltage ($V_R$) plus a common mode voltage ($V_{CM}$). The output 314 of adder 301 is $(V_L+V_{CM})-V_{CM}=V_L$. The output 312 of adder 303 is $(V_R+V_{CM})-V_{CM}=V_R$. The output 320 of adder 212 is $V_L+V_R$ and is applied to amplifier 204. Amplifier 204 produces an output signal 322 that is used as a feedback (FB) signal to the left and right signal paths. The output 322 if FB=$(-\frac{1}{2})(V_L+V_R)$. The amplifier 204, and therefore the output signal 322, may be assumed to clip at certain values such as +1 volt or −1 volt.

The output 318 of adder 214 is $V_L$+FB. In a non-clipped situation, FB=$(-\frac{1}{2})(V_L+V_R)$, and the output 318 will be $V_L$+FB=$V_L+(-\frac{1}{2})(V_L+V_R)=(V_L-V_R)/2$. Similarly, the output 316 of adder 210 is $V_R$+FB. In a non-clipped situation, FB=$(-\frac{1}{2})(V_L+V_R)$, and the output 316 will be $V_R$+FB=$V_R+(-\frac{1}{2})(V_L+V_R)=(V_R-V_L)/2$. The output 318 is fed to amplifier 206 to provide output 324, and output 316 is fed to amplifier 202 to provide output 326. As with amplifier 204 above, amplifiers 202 and 206 may be assumed to clip at certain values such as +1 volt or −1 volt.

In non-clipped situations, the left (L) channel output signal ($L_{OUT}$) 112 from adder 220, the right (R) channel output signal ($R_{OUT}$) 110 from adder 224, and the common mode (CM) output signal ($CM_{OUT}$) 114 from adder 226 are as follows:

$$L_{OUT}=V_{CM}+(V_L-V_R)/2;$$

$$R_{OUT}=V_{CM}+(V_R-V_L)/2; \text{ and}$$

$$CM_{OUT}=V_{CM}-(V_L+V_R)/2.$$

The signals which are actually applied to the right and left speakers of the headphone 108 in non-clipped situations are the following:

$$L_{speaker}=L_{OUT}-CM_{OUT}=[V_{CM}+(V_L-V_R)/2]-[V_{CM}-(V_L+V_R)/2]=V_L; \text{ and}$$

$$R_{speaker}=R_{OUT}-CM_{OUT}=[V_{CM}+(V_R-V_L)/2]-[V_{CM}-(V_R+V_L)/2]=V_R.$$

For the embodiment of FIG. 3 and again assuming clipping at $V_{CM}\pm 1$ volt, the signal applied across the left and right speakers will clip whenever the instantaneous value of $|V_L-V_R|>2$, or when $|V_L|$ or $|V_R|>2$. Considering the third case situation above for this embodiment with $V_L$ and $V_R$=+2 volts, the $CM_{OUT}$ signal would ideally be driven to $V_{CM}-2$ volts, and the $L_{OUT}$ signal and the $R_{OUT}$ signal would ideally be driven to $V_{CM}$. According to the equations above, therefore, the desired resulting ideal signals to the left and right speakers are $L_{speaker}=R_{speaker}=+2$ volts. Because of clipping in the amplifier 204, however, the output signal 322 of amplifier 204 will be clipped to −1 volt, and the $CM_{OUT}$ signal will be clipped to $V_{CM}-1$ volt.

The feedback (FB) signal 322 applied to adders 210 and 214 in the left and right channel paths compensates for this clipping condition. Because this feedback signal is also not ideal, having been clipped at −1 volt, the output 316 of adder 210 and the output 318 of adder 214 will adjust to +1 volt instead of an ideal 0 volts. For this clipped situation, therefore, the left and right channel output signals 112 ($L_{OUT}$) and 110 ($R_{OUT}$) will adjust to produce $L_{OUT}=R_{OUT}=V_{CM}+1$ volt instead of the ideal $V_{CM}$ volts. The resulting signal actually sent to the left and right speakers will then be $L_{speaker}=L_{OUT}-CM_{OUT}=(V_{CM}+1)-(V_{CM}-1)$ =+2 volts, and $R_{speaker}=R_{OUT}-CM_{OUT}=(V_{CM}+1)-(V_{CM}-1)$ =+2 volts. Thus, the present invention provides the desired resulting signal to the left and right speakers even though the common mode output signal was clipped at $V_{CM}-1$ volt.

The quasi-differential power amplifier of the present invention, therefore, provides particularly advantageous results for case three situations where audio program material contains a large imbalance in signal levels or that contains signals in which the peak excursions are largely in phase with each other. For case two situations, in which signals have peak excursions which are perfectly out of phase, the quasi-differential power amplifier of the present invention does not tend to improve performance and clips at substantially the same point as the fixed common mode voltage approach. However, actual peak levels in the material being processed by the digital audio source occur infrequently and are perfectly out of phase with each other only a small percentage of the time. Thus, case two situations are less of a concern.

Figure 4:
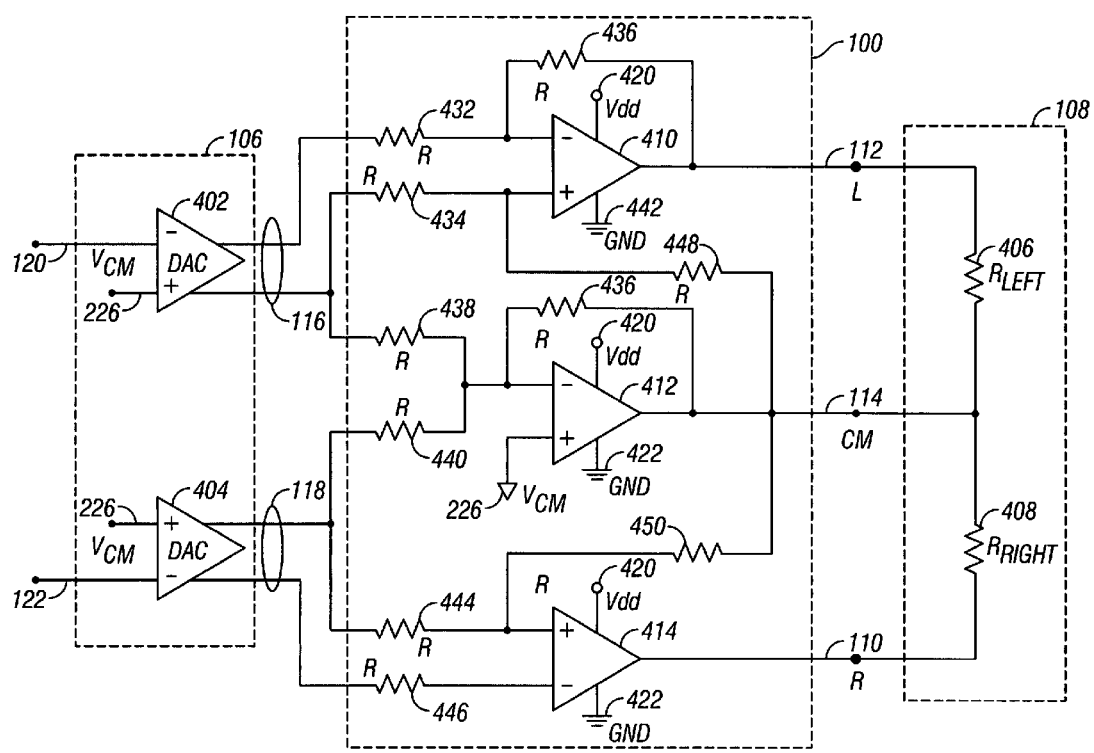
FIG. 4 is a circuit configuration for the quasi-differential power amplifier depicted in FIG. 3.

Referring now to FIG. 4, a circuit implementation is shown for the quasi-differential headphone power amplifier 100 depicted in the block diagram of FIG. 3. DAC 106 includes a left (L) channel path DAC 402 and a right (R) channel path DAC 404 that drive the power amplifier 100. DACs 402 and 404 may be fully-differential switched-capacitor DACs. The volume adjusted left (L) channel output 120 is an input to the left (L) channel DAC 402. Similarly, the volume adjusted right (R) channel output 122 is an input to the right (R) channel DAC 404. Common mode voltage ($V_{CM}$) 226 is an additional input to both left (L) channel DAC 402 and right (R) channel DAC 404. The positive and negative outputs of left (L) channel DAC 402 make up the analog left (L) channel output 116 from DAC 106, which is a differential input to quasi-differential power amplifier 100. The positive and negative outputs of right (R) channel DAC 404 make up the analog right (R) channel output 118 from DAC 106, which is a differential input to the quasi-differential power amplifier 100. It is noted that the embodiment for DAC 106 depicted in FIG. 4 is an example embodiment and that alternative implementations including a larger or smaller number of DACs or different DAC circuitry could be designed and utilized.

Quasi-differential power amplifier 100 includes a left (L) channel operational amplifier (OPAMP) 410 driving the left (L) channel signal 112, a right (R) channel OPAMP 414 driving the right (R) channel signal 110, and a common mode OPAMP 412 driving the common mode (CM) signal 114. OPAMPs 410, 412, and 414 are connected to a power supply ($V_{dd}$) 420, which may be 3 volts, and a circuit ground (GND) 422. The negative differential output of left (L) channel DAC 402 is connected to the negative input terminal of OPAMP 410 through a resistor 432. The positive differential output of left (L) channel DAC 402 is connected through a resistor 434 to the positive input terminal of OPAMP 410 and through a resistor 438 to a negative input terminal of OPAMP 412. The negative differential output of right (R) channel DAC 404 is connected to the negative input terminal of OPAMP 414 through a resistor 446. The positive differential output of right (R) channel DAC 404 is connected through a resistor 444 to the positive input terminal of OPAMP 414 and through a resistor 440 to a negative input terminal of OPAMP 412. As feedback, the output of OPAMP 412 is connected to the negative input terminal of OPAMP 412 through resistor 442, to the positive input terminal of OPAMP 410 through resistor 448, and to the positive input OPAMP 414 through resistor 450. Also, as with resistor 436 and OPAMP 410, resistor 437 is attached between the output of OPAMP 414 and the negative input terminal of OPAMP 414. The resistors 432, 434, 436, 437, 438, 440, 442, 444, 446, 448, and 450 may be matched resistors. It is noted that the embodiment for quasi-differential power amplifier 100 depicted in FIG. 4 is an example embodiment and that alternative implementations including a larger or smaller number of amplifiers or different amplifier circuitry could be designed and utilized.

The three-wire headphones 108 include a left (L) channel speaker represented by resistor ($R_{LEFT}$) 406 and a right (R) channel speaker represented by resistor ($R_{RIGHT}$) 408, which may each be 32 Ω. Resistor ($R_{LEFT}$) 406 is connected between the left (L) channel signal 112, which is driven by the left (L) channel OPAMP 414, and to the common mode (CM) signal 114, which is driven by the common mode OPAMP 412. Resistor ($R_{RIGHT}$) 408 is connected between the right (R) channel signal 110, which is driven by the right (R) channel OPAMP 414, and the common mode (CM) signal 114, which is driven by the common mode OPAMP 412.

In operation, the left (L) channel path DAC 402 provides a positive differential output ($V_{L+}$) and a negative differential output ($V_{L-}$), and the right (R) channel path DAC 404 provides a positive differential output ($V_{R+}$) and a negative differential output ($V_{R-}$). The common mode signal output ($CM_{OUT}$) 114 driven by OPAMP 412 is $CM_{OUT}=V_{CM}-V_{R+}-V_{L+}$. This signal is fed back to OPAMP 410 and OPAMP 414 and is used as a reference signal for the differential to single-ended conversion performed by OPAMP 410 and OPAMP 414. The output signal ($L_{OUT}$) of the left channel OPAMP 410 is $L_{OUT}=V_{L+}-V_{L-}+CM_{OUT}$. In ideal situations without clipping of $CM_{OUT}$, $L_{OUT}$ will be $L_{OUT}=V_{CM}-V_{R+}-V_{L-}$. Similarly, the output signal ($R_{OUT}$) of the right channel OPAMP 414 is $R_{OUT}=V_{R+}-V_{R-}+CM_{OUT}$. And in ideal situations without clipping, $R_{OUT}$ will be $R_{OUT}=V_{CM}-V_{L+}-V_{R-}$. In a non-clipping situation, therefore, the signals which are actually applied to the right and left speakers 406 and 408 of the headphone 108 are the following:

$L_{speaker}=L_{OUT}-CM_{OUT}=[V_{CM}-V_{R+}-V_{L-}]-[V_{CM}-V_{R+}-V_{L+}]=V_{L+}-V_{L-}$; and $R_{speaker}=R_{OUT}-CM_{OUT}=[V_{CM}-V_{L+}-V_{R-}]-[V_{CM}-V_{R+}-V_{L+}]=V_{R+}-V_{R-}$.

These outputs correlate to the differential output of the DACs 402 and 404, which could potentially swing 4 $V_{pp}$.

Similar to the discussion above with respect to FIG. 3, the embodiment of the present invention depicted in FIG. 4 handles certain clipping conditions on $CM_{OUT}$ through the use of the $CM_{OUT}$ signal as feedback to the right and left channel signals. For example, assuming the $V_{R+}=V_{L+}=+1$ volts and the $V_{R-}=V_{L-}=-1$ volts, $CM_{OUT}$ would ideally be driven to $CM_{OUT}=V_{CM}-2$ volts, and $L_{OUT}$ and $R_{OUT}$ would ideally be driven to $L_{OUT}=R_{OUT}=V_{CM}$. Thus, without clipping, the signals actually applied to the left and right speakers would be $R_{speaker}=L_{speaker}=+2$ volts. Assuming now that $CM_{OUT}$ clips at $V_{CM}-1$ volts, $L_{OUT}$ and $R_{OUT}$ will adjust accordingly so that the resulting speaker output signals are still ideal. In particular, $L_{OUT}$ will adjust such that $L_{OUT}=V_{L+}-V_{L-}+CM_{OUT}=+1-(-1)+(V_{CM}-1)=V_{CM}+1$ volts. Similarly, $R_{OUT}$ will adjust such that $R_{OUT}=V_{R+}-V_{R-}+CM_{OUT}=+1-(-1)+(V_{CM}-1)=V_{CM}+1$ volts. Even with clipping as assumed above, therefore, the signals actually applied to the left and right speakers according to the embodiment of the present invention in FIG. 4 will be $R_{speaker}=L_{speaker}=+2$ volts.

It should be noted that rather than an analog implementation, the quasi-differential approach of the present invention could be implemented in the digital data path. In this case, DACs and amplifiers could be used to drive the outputs of digital processors to the desired signal output levels. This digital approach has the advantage that the differential to single-ended signal combination is performed in the digital domain, but has the disadvantage of requiring additional DACs.

Figure 5:
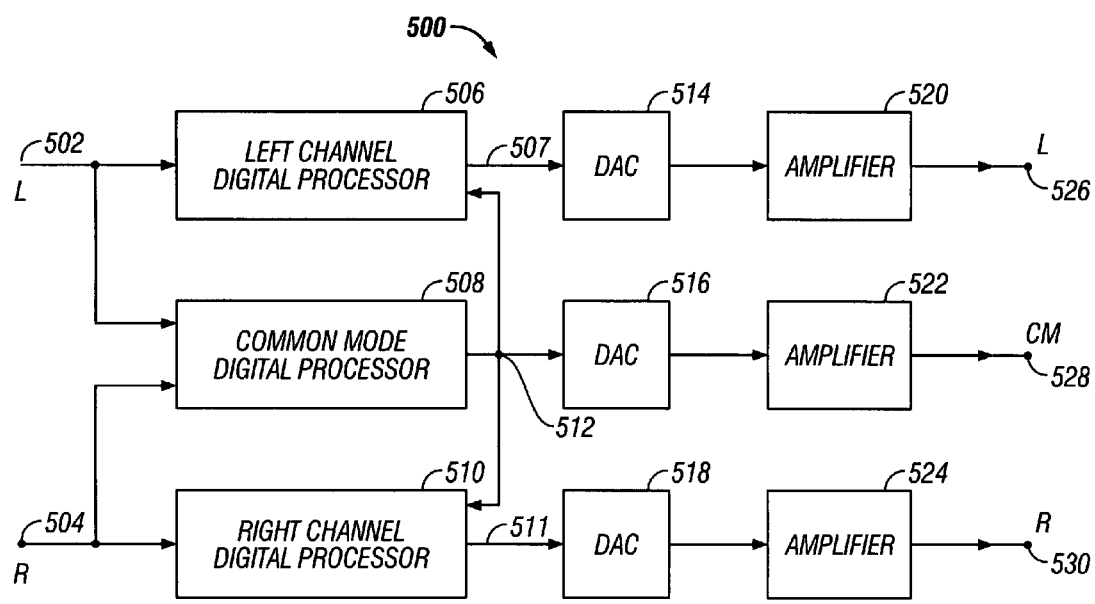
FIG. 5 is a block diagram of another alternative embodiment of a quasi-differential power amplifier according to the present invention.

FIG. 5 depicts an example embodiment 500 for such a digital path approach for a quasi-differential power amplifier according to the present invention. Signal 502 may be a digital left (L) channel audio input signal, and signal 504 may be a digital right (R) channel audio input signal. A common mode digital processor 504 may receive both the digital left (L) and right (R) channel audio input signals 502 and 504. The common mode digital processor 504 may process these two input signals as desired and provide an output signal 512 that is dependent upon the left (L) and right (R) channel audio input signals 502 and 504. This common mode output signal 512 may then be used as the feedback signal to the left and right channel signal paths.

The left channel digital processor 506 may receive the digital left (L) channel audio input signal 502 and the feedback signal 512. The left channel digital processor 506 may process these two input signals as desired and provide an output signal 507 that is dependent upon the left (L) channel input signal 502 and the common mode feedback signal 512. Similarly, the right channel digital processor 510 may receive the digital right (R) channel audio input signal 504 and the feedback signal 512. The right channel digital processor 510 may process these two input signals as desired and provide an output signal 511 that is dependent upon the right (R) channel input signal 504 and the common mode feedback signal 512. Because the common mode feedback signal 512 is dependent upon both the left (L) and right (R) channel audio input signals 502 and 504, the output signal 507 from the left channel digital processor 506 and the output signal 511 from the right channel digital processor 510 are also dependent upon both the left (L) and right (R) channel audio input signals 502 and 504.

DACs 514, 516 and 518 may be used to convert the digital processor output signals 507, 512 and 511, respectively, to analog signals. Amplifiers 520, 522 and 524 may be connected to DACs 514, 516 and 518, respectively, to drive the left channel output signal 526, the common mode output signal 528, and the right channel output signal 530.

What is claimed is:

1. An amplifier for driving two speakers across a three-wire interface comprising:
a first differential amplifier for receiving a pair of differential right channel signals referenced to a common mode voltage and outputting a right channel output signal representing a combination of a difference between the pair of differential right channel signals and a common mode output signal;

a second differential amplifier for receiving a pair of differential left channel signals referenced to the common mode voltage and outputting a left channel output signal representing a combination of a difference between the differential left channel signals and the common mode output signal; and a third differential amplifier receiving a combination of a first one of the pair of differential right channel signals, a first one of the pair of differential left channel signals and the common mode voltage, and outputting the common mode output signal.

2. The amplifier of claim 1, wherein the combination of a difference between the pair of differential right channel signals and the common mode output signal comprises a sum of the difference between the pair of differential right channel signals and the common mode output signal and the combination of the difference between the pair of differential left channel signals and a common mode output signal comprises a sum of the difference between the pair of differential left channel signals and the common mode output signal.

3. The amplifier of claim 1, wherein the first one of the pair of right differential channel signals is presented to a non-inverting input of the first differential amplifier and the first one of the pair of left differential channel signals is presented to a non-inverting input of the second differential amplifier.

4. The amplifier of claim 1, wherein the common mode output signal is fed-back to a non-inverting terminal of the first differential amplifier and a non-inverting terminal of the second differential amplifier.

5. The amplifier of claim 1, further comprising:

a first digital to analog converter for generating the pair of differential right channel signals referenced to the common mode voltage; and a second digital to analog converter for generating the pair of differential left channel signals referenced to the common mode voltage.

* * * * *